(12) United States Patent
Vetter

(10) Patent No.: US 8,309,234 B2
(45) Date of Patent: Nov. 13, 2012

(54) MULTILAYER FILM-COATED MEMBER AND METHOD FOR PRODUCING IT

(75) Inventor: Jörg Vetter, Bergisch-Gladbach (DE)

(73) Assignee: Sulzer Metaplas GmbH, Bergisch-Gladbach (DE)

( * ) Notice: Subject to any disclaimer, the term of this patent is extended or adjusted under 35 U.S.C. 154(b) by 284 days.

(21) Appl. No.: 12/511,439

(22) Filed: Jul. 29, 2009

(65) Prior Publication Data

US 2010/0081000 A1    Apr. 1, 2010

(30) Foreign Application Priority Data

Jul. 31, 2008    (EP) ..................... 08161530

(51) Int. Cl.
*B32B 9/00*    (2006.01)

(52) U.S. Cl. ....... 428/697; 51/307; 51/309; 204/192.15; 204/192.16; 428/698; 428/699; 428/704

(58) Field of Classification Search .................. 428/697, 428/698, 699, 704; 204/192.15, 192.16; 51/307, 309
See application file for complete search history.

(56) References Cited

U.S. PATENT DOCUMENTS

| | | | |
|---|---|---|---|
| 6,296,928 B1 * | 10/2001 | Yamada et al. | 428/697 |
| 6,586,122 B2 * | 7/2003 | Ishikawa et al. | 428/699 |
| 7,166,155 B2 * | 1/2007 | Ishikawa | 428/697 |
| 7,348,074 B2 * | 3/2008 | Derflinger | 428/699 |

(Continued)

FOREIGN PATENT DOCUMENTS

EP    1783245 A    5/2007

(Continued)

OTHER PUBLICATIONS

Hegemann et al "PACVD_Derived Thin Films in the System Si-B-C-N" Chemical Vapor Depostion vol. 5, Issue 2, Mar. 1999, p. 61-65.*

(Continued)

*Primary Examiner* — Archene Turner
(74) *Attorney, Agent, or Firm* — Robert S. Green

(57) ABSTRACT

The invention provides a multilayer film-coated member having sufficient heat resistance and abrasion resistance and capable of exhibiting an effect of preventing adhesion even in cutting work of steel materials that may readily cause adhesion to cutting tools, and therefore capable of prolonging tools, and provides a method for producing it. The multilayer film-coated member is fabricated by coating the surface of a substrate with at least two hard coating films having different compositions, in which the first composition hard coating film of the outermost layer of the hard coating films represented by $Si_aB_bN_cC_dO_e$ with $a+b+c+d+e=1$, $0.1 \leq a \leq 0.5$, $0.01 \leq b \leq 0.2$, $0.05 \leq c \leq 0.6$, $0.1 \leq d \leq 0.7$ and $0 < e \leq 0.2$, the second composition hard coating film of the lower layer below the first composition hard coating film is a hard film having at least two selected from Al, Ti, Cr, Ni, Ce, Mg, Nb, W, Si, V, Zr, and Mo and N and at least one selected from B, C, O and S and in X-ray photoelectric spectrometry (XPS) of the first composition hard coating film, Si—O bond and B—O bond are detected, the ratio of the peak area α of Si—C to the peak area β of Si—O, α/β, as obtained from the peak separation of the 2p orbit of Si, satisfies $10.0 \leq \alpha/\beta \leq 20.0$, and the ratio of the peak area X of B—O to the peak area Y of B—N, X/Y, as obtained from the peak separation of the 1s orbit of B, satisfies $5.0 \leq X/Y \leq 10.0$.

13 Claims, 4 Drawing Sheets

U.S. PATENT DOCUMENTS

Figure 1:
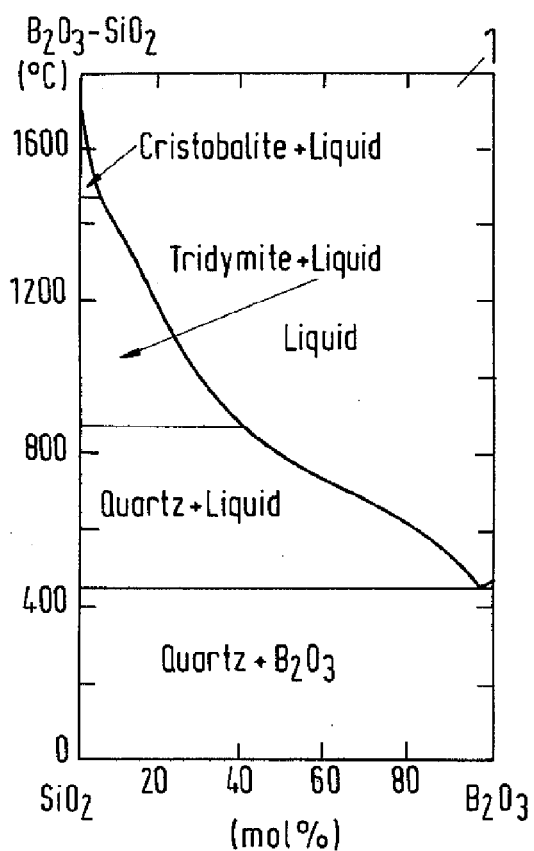

| | | | |
|---|---|---|---|
| 7,410,707 B2 * | 8/2008 | Fukui et al. | 428/699 |
| 7,504,149 B2 * | 3/2009 | Toihara et al. | 428/697 |
| 7,935,426 B2 * | 5/2011 | Vetter | 428/698 |

FOREIGN PATENT DOCUMENTS

| | | |
|---|---|---|
| JP | 2000-129463 A | 5/2000 |
| JP | 2000-297365 * | 10/2000 |
| JP | 2001-328008 A | 11/2001 |
| JP | 2007 126714 A | 5/2007 |

OTHER PUBLICATIONS

European Search Report for application 08161530.4 dated Jan. 21, 2009.

* cited by examiner

001
MULTILAYER FILM-COATED MEMBER AND METHOD FOR PRODUCING IT

CROSS-REFERENCE TO RELATED APPLICATIONS

The present application claims priority under 35 U.S.C. §119 of European Patent Application No. 08161530.4 filed on Jul. 31, 2008, the disclosure of which is expressly incorporated by reference herein in its entirety.

BACKGROUND OF THE INVENTION

1. Field of the Invention

The present invention relates to a multilayer film-coated member fabricated by forming a multilayer film on a substrate for abrasion-resistant members for cutting tools, molds and combustion engines or for members requiring heat resistance and abrasion resistance for airplanes, ground turbines, engines, gaskets, gears, pistons and others, and relates to a method for producing it.

2. Background Art

In cutting work for cutting steel material, a type of hardly-cuttable material, there may happen a phenomenon of adhesion of the steel material to the edges of the cutting tool used. Owing to the adhesion, the edges lose stability, and the tool life is extremely shortened. Many trials for solving the problems have heretofore been made. For preventing the adhesive phenomenon, it has heretofore been investigated to improve the lubricative characteristics of coating film and to use coating film having low affinity to the object to be worked. For example, in Patent Reference 1, it is proposed to improve the hardness and the lubricative characteristics a cutting tool of cemented carbide by coating it with a TiVCN film formed by adding V and C to a TiN film. In Patent Reference 2, proposed is a CrSiBN coating film, and this is improved over a Cr-base coating film having low affinity to iron-based steel material, in point of the lubricative characteristics and the hardness. In Patent Reference 3, proposed is a coating film having improved heat resistance and hardness and applicable to high-speed working.

Patent Reference 1: JP-A 2000-129463
Patent Reference 2: JP-A 2001-328008
Patent Reference 3: JP-A 2007-126714

The field of cutting work is grouped into a field of mold working and a field of parts working. In any field, heretofore, lead is added to steel material as an easily-cuttable ingredient therein; recently, however, lead is removed from many steel materials for reducing the environmental load. Accordingly, owing to the removal of the lead ingredient therefrom, the recent steel materials are hardly cuttable as objects to be worked. Further, in the recent mold working field, the users' needs are prolongation of mold life, and various elements are added to the steel material for mold so as to meet the needs of mold life prolongation. Accordingly, the material characteristics of steel material are improved, but on the contrary, the machinability thereof is worsened. In the field of parts working, especially for parts for combustion engines, the parts are desired to be resistant to high temperatures as the exhaust gas temperature rises from the viewpoint of mileage improvement. With that, materials resistant to high temperatures are selected; and use of Ti alloy and Ni-base ultra-heat-resistant alloy, which have not been used so much in the field, is increasing. The materials are hardly-cuttable materials and their machinability is extremely poor. The important factors are that they may readily adhere to cutting tools and the working heat increases owing to their poor thermal conductivity. One serious problem is that they may readily adhere to cutting tools. For preventing the adhesive phenomenon, it is said that improving the lubricative characteristics of coating film and using coating film with low affinity to objects to be worked may be effective; however, these depend on the compatibility between coating film and steel material, and therefore these may be ineffective for different steel materials. It has been confirmed that all the techniques in the above-mentioned patent references are effective for specific steel materials, but their effects could not be confirmed for various and different steel materials.

SUMMARY OF THE INVENTION

Accordingly, an object of the present invention is to provide a hard coating film capable of preventing adhesion of steel material to it, irrespective of the type of steel material. Another object of the invention is to provide a multilayer film-coated member fabricated by coating a substrate with plural layers of such hard coating films.

The invention is a multilayer film-coated member fabricated by coating the surface of a substrate with at least two hard coating films having different compositions, which has at least a first composition hard coating film to be the outer layer of the member and a second composition hard coating film to be the inner layer thereof, and in which the first composition hard coating film represented by $Si_aB_bN_cC_dO_e$ with $a+b+c+d+e=1$, $0.1 \leq a \leq 0.5$, $0.01 \leq b \leq 0.2$, $0.05 \leq c \leq 0.6$, $0.1 \leq d \leq 0.7$ and $0 < e \leq 0.2$, the second composition hard coating film of the under layer below the first composition hard coating film is a hard film having at least two selected from Al, Ti, Cr, Ni, Ce, Mg, Nb, W, Si, V, Zr and Mo and N and at least one selected from B, C, O, and S and in X-ray photoelectric spectrometry (XPS) of the first composition hard coating film, Si—O bond and B—O bond are detected, the ratio of the peak area α of Si—C to the peak area β of Si—O, α/β, as obtained from the peak separation of the 2p orbit of Si, satisfies $2.0 \leq \alpha/\beta \leq 50.0$, and the ratio of the peak area X of B—O to the peak area Y of B—N, X/Y, as obtained from the peak separation of the 1s orbit of B, satisfies $1.0 \leq X/Y \leq 50.0$.

In the multilayer film-coated member of the invention, the Si oxide and the B oxide in the coating film form a flux owing to external heat applied thereto, thereby coating the member surface, and the member may thereby prevent material adhesion thereto. Since the coating film contains Si and B oxides, they may readily form a flux. FIG. 1 shows a phase diagram of $SiO_2$—$B_2O_3$. The melting point of $SiO_2$ is not lower than 1600° C., but the melting point of $B_2O_3$ is about 450° C. $SiO_2$ and $B_2O_3$ undergo eutectic reaction, and form a flux of mixture of $SiO_2$ and $B_2O_3$ at a temperature lower than their melting point. The flux formed at such a low temperature covers the surface of the multilayer film-coated member of the invention, thereby preventing adhesion of steel material to the member.

DESCRIPTION OF THE PREFERRED EMBODIMENTS

The multilayer film-coated member of the invention is fabricated by coating the surface of a substrate with at least two hard coating films having different compositions, which has at least a first composition hard coating film to be the outer layer of the member and a second composition hard coating film to be the inner layer thereof, and in which the first composition hard coating film represented by $Si_aB_bN_cC_dO_e$ with $a+b+c+d+e=1$, $0.1 \leq a \leq 0.5$, $0.01 \leq b \leq 0.2$, $0.05 \leq c \leq 0.6$, $0.1 \leq d \leq 0.7$ and $0 < e \leq 0.2$, the second composition hard coating film of the under layer below the first composition hard coating film is a hard film having at least two selected from Al, Ti, Cr, Ni, Ce, Mg, Nb, W, Si, V, Zr and Mo and N and at least one selected from B, C, O and S and in X-ray photoelectric spectrometry (XPS) of the first composition hard coating film, Si—O bond and B—O bond are detected, the ratio of the peak area α of Si—C to the peak area β of Si—O, α/β, as obtained from the peak separation of the 2p orbit of Si, satisfies $10.0 \leq \alpha/\beta \leq 20.0$, and the ratio of the peak area X of B—O to the peak area Y of B—N, X/Y, as obtained from the peak separation of the 1s orbit of B, satisfies $5.0 \leq X/Y \leq 10.0$.

The reason for the definition of the composition of the first composition hard coating film in the invention is described. The first composition hard coating film in the invention comprises Si, B, C, N and O as the indispensable ingredients, and is represented by $Si_a B_b N_c C_d O_e$. Boron (B), carbon (C) and nitrogen (N) are ingredients effective for increasing the hardness of the hard coating film and for improving the heat resistance and the lubricity thereof. In addition, O is an ingredient effective for improving the lubricity and the heat resistance of the film. The above-mentioned a, b, c, d and e satisfy $a+b+c+d+e=1$; and the Si content is $0.1 \leq a \leq 0.5$. When a is less than 0.1, then the effect of improving the heat resistance and increasing the hardness is insufficient. When a is more than 0.5, then the hardness lowers. The value b that indicates the B content is $0.01 \leq b \leq 0.2$. In case where the film does not contain B, then the hardness and the heat resistance of the film are insufficient, and the film is too brittle with the result that the film may be delaminated and its cutting performance could not be improved. Accordingly, b is at least 0.01 in the definition thereof mentioned above. B is effective for improving the lubricity characteristics of the film. However, B may readily react with oxygen, and therefore, if too much B is added to the film, it may worsen the film characteristics and the film adhesion strength. Accordingly, the amount of B is desirably the lowermost amount necessary for improving the film characteristics, and the uppermost limit of the amount is up to $b=0.2$. When $a+b+c+d+e=1$, more preferably $0.05 < b < 0.2$. Adding both Si and B to the film improves both the hardness and the heat resistance of the film. This is especially remarkable when Si exists as its boride. The value c that indicates the N content is $0.05 \leq c \leq 0.6$. When the film does not contain N, then the hardness and the heat resistance of the film could not be improved, and therefore as its definition, c is at least 0.05. If too much N is in the film, the Si—N bond in the film may increase to lower the hardness of the film. Accordingly, the uppermost limit of the amount of N is up to $c=0.6$. When $a+b+c+d+e=1$, more preferably $0.1 < c < 0.35$. The value d that indicates the C content is $0.1 \leq d \leq 0.7$. When the film does not contain C, then the hardness of the film is insufficient, and therefore as its definition, d is at least 0.1. If too much C is in the film, free carbon having a low hardness may exist in the film, thereby lowering the hardness of the film. Accordingly, the uppermost limit of the amount of C is up to $d=0.7$. When $a+b+c+d+e=1$, more preferably $0.15 < d < 0.4$. The content of O is $0 < e \leq 0.2$. Many of the constitutive elements of the film readily take oxygen therein, and the film always contains oxygen as an impurity, and therefore as its definition, e is more than 0. Thus previously containing oxygen, oxygen diffusion in the film may be reduced in abrasive environments, and therefore the oxidation resistance of the film even at high temperatures may be improved. However, if too much oxygen is in the film, it may lower the hardness of the film. Accordingly, the uppermost limit of O is up to $e=0.2$. When $a+b+c+d+e=1$, more preferably $0.01 < e < 0.15$. In case where the film contains O to a high degree within the defined range, the O content profile in the film is preferably such that the oxygen content is the highest in the vicinity of the surface layer within a range of from the uppermost surface of the hard coating film toward a depth of less than 500 nm in the film thickness direction, from the viewpoint of the lubricity of the film in abrasive environments.

The oxygen (O) content profile in the multilayer coating film in the invention is preferably such that the oxygen content is the highest in the vicinity of the surface layer within a range of from the uppermost surface of the hard coating film toward a depth of less than 500 nm in the film thickness direction, from the viewpoint of the lubricity of the film in abrasive environments. Oxygen must exist in the film as oxides of silicon (Si) and boron (B). In case where oxygen exists in the film as a solid solution of its free element, then it forms a Si oxide and a B oxide with the increase in the cutting temperature during cutting work. In this case, the components of the object being cut may diffuse inside the coating film, thereby causing adhesion to the film, and the mechanical characteristics of the coating film may be thereby worsened. Accordingly, it is necessary that oxygen exists in the coating film as previously formed oxides. The first composition hard coating film is a hard film capable of exhibiting especially excellent heat resistance and abrasion resistance, and therefore, as its preferred laminate structure, the first film forms the outermost layer of the hard coating film.

Figure 2:
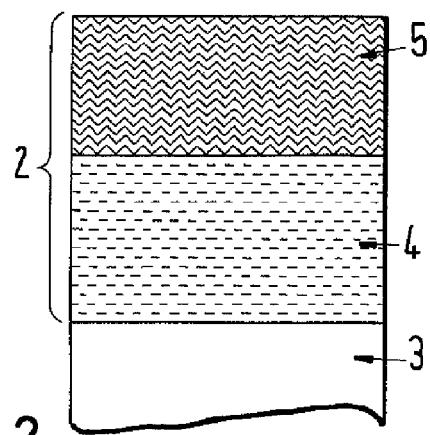
Figure 3:
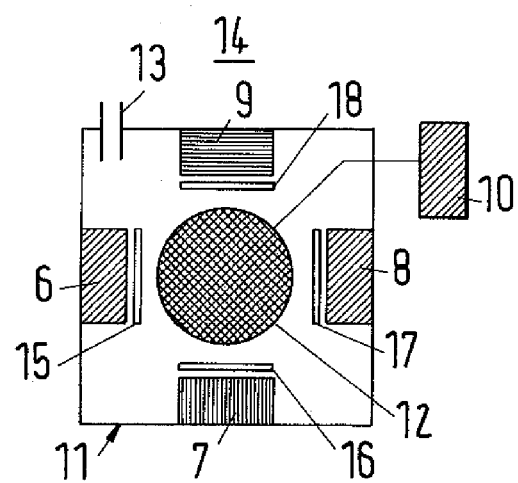
Figure 4:
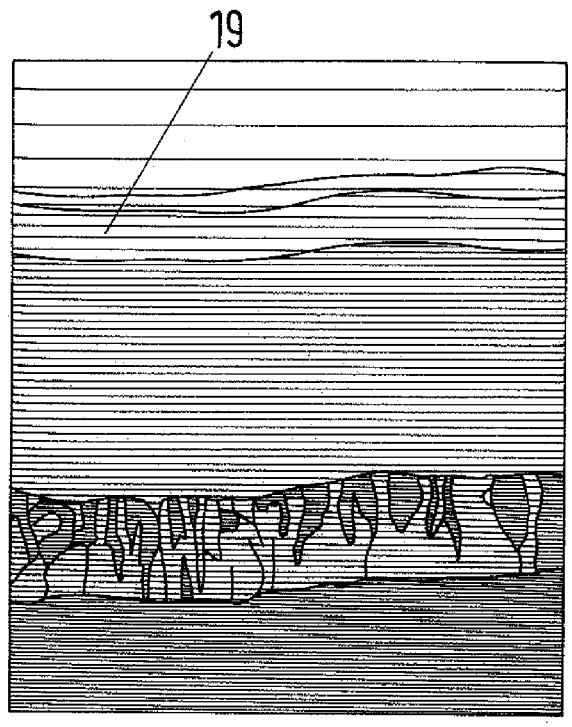
Figure 5:
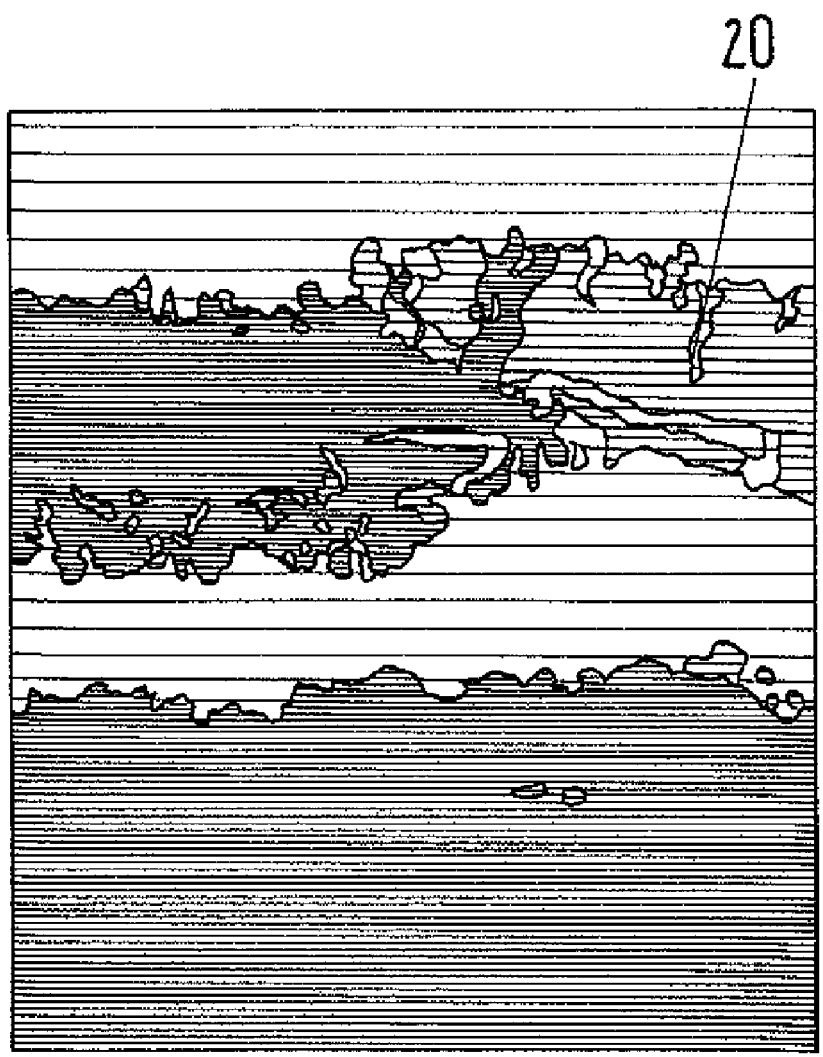
Figure 6:
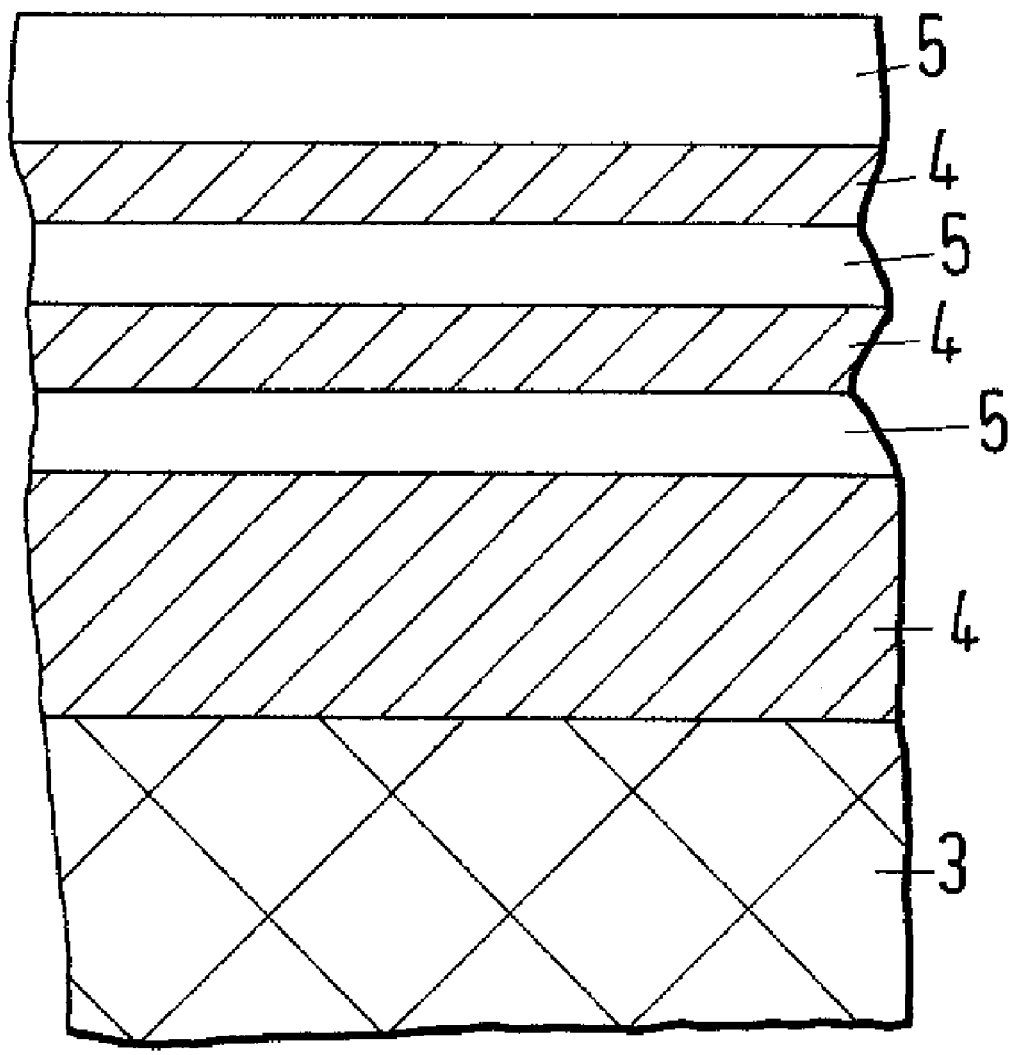

In the following the invention is described in more detail with the help of the drawings which show:

FIG. 1: B2O3-SiO2 binary phase diagram by T. J. Rocket and W. R. Foster, J. Am. Ceram. Soc., 48 [2] 78 (1965);

FIG. 2: partial constructional example of a multilayer film-coated member having two hard coating films;

FIG. 3: schematic illustration of structure of a coating machine;

FIG. 4: transmission electronic microscope image of sample 1 after heat treatment;

FIG. 5: transmission electronic microscope image of sample 17 after heat treatment;

FIG. 6: a preferred embodiment of a multi layer film-coated member according to the invention.

An embodiment of the layer constitution is shown in FIG. 2. The second composition hard coating film may have a multilayer structure, and the first composition hard coating layer may have a multilayer structure. Both the first composition hard coating layer and the second composition hard coating film may have a multilayer structure.

The first composition hard coating film in the invention comprises Si, B, C, N and O as the indispensable ingredients so as to have the characteristics of abrasion resistance and heat resistance. Oxygen sticking to the target surface may be taken into the film, and therefore, it is desirable to clean the target surface by preliminary discharging. Since the first composition hard coating film may readily take oxygen thereinto in the initial stage of the film formation, the RF sputtering output power in the preliminary discharging is desirably a relatively high output power of from 500 W to 2500 W or so, and this may be effective for preventing the film from taking oxygen therein. The film formation must be so controlled that the film-forming temperature in film formation around the surface layer is controlled to fall within a range of from 200° C. to 600° C. and/or oxygen gas is used as the reaction gas in film formation and the flow rate ratio of O to the process gas Ar, O/Ar is controlled to be $0.01 \leq O/Ar \leq 0.1$. Oxygen sticking to the target surface may be taken into the film, and therefore, it is desirable to clean the target surface by preliminary discharging. Combining the temperature control and the preliminary discharging is more preferred. Since the first composition hard coating film may readily take oxygen thereinto in the initial stage of the film formation, it is necessary that the RF sputtering output power in the preliminary discharging is a relatively high output power of from 500 W to 2500 W or so and the subsequent film formation is started at a low output power of 100 W or so in the initial stage of film formation (the film-forming speed is at most 0.25 nm/hr). The result of XPS must be as follows: The ratio of the peak area α of Si—C to the peak area β of Si—O, α/β, as obtained from the peak separation of the 2p orbit of Si, satisfies $10.0 \leq \alpha/\beta \leq 20.0$, and the ratio of the peak area X of B—O to the peak area Y of B—N, X/Y, as obtained from the peak separation of the 1s orbit of B, satisfies $5.0 \leq X/Y \leq 10.0$. The data may be controlled by satisfying the above-mentioned film-forming conditions. The computation method is as follows: The peak in the 2p orbit of Si and the peak in the 1s orbit of B are separated into Si—C, Si—O, and B—O, B—N, and eh peak areas α, β and X, Y are computed. From the areas α, β and X, Y, the peak area ratio α/β and X/Y are computed. When the ingredients contain larger quantities of Si—O bond and B—O bond, then they may form a larger amount of fluid, but may greatly lower the film hardness. Accordingly, it is desirable that the Si—C bond and the B—N bond are limited to a specific range. On the other hand, when the quantities of Si—O bond and the B—O bond are too small, then the fluid formation would be insufficient, and the film could not exhibit its lubricative effect and adhesion-preventing effect. Accordingly, the ratio must satisfy $10.0 \leq \alpha/\beta \leq 20.0$ and $5.0 \leq X/Y \leq 10.0$.

As combined with the first composition hard coating film, the second composition hard coating film exhibits excellent adhesion strength and abrasion resistance in practical use. However, in case where the second composition hard coating film contains Si, its atomic ratio must be less than 0.5 to the metal element of 1.0, and thus, the second film is differentiated from the first composition hard coating film. The main role of the second composition hard coating film is that it serves as an assistant so that the first composition hard coating film may sufficiently exhibit its effect. The second composition hard coating film may have a multilayered structure such as (TiAl)N/(TiSi)N. Having (TiSi)N between the first composition hard coating film and (AlTi)N, the film may have improved abrasion resistance and adhesiveness. As the case may be, the ratio of the first composition hard coating film to the overall multilayer hard coating film could not be increased from the viewpoint of the residual compression stress, and in such a case, the second composition hard coating film is made thick. A preferred thickness ratio of the first composition hard coating film and the second composition hard coating film is such that, when the overall thickness is considered 100, the ratio of the first composition hard coating film is from 2% to 50%. In order that the first composition hard coating film could sufficiently exhibit its characteristics, the adhesion strength of the second composition hard coating film to the substrate surface, and the hardness and the residual compression stress thereof are important factors. Especially preferred compositions of the second composition hard coating film are (AlTi)N, (AlCr)N, (AlCrSi)N, (TiSi)N, (AlTiSi)N, from the viewpoint of the adhesion strength to the substrate and the adhesion strength to the first composition hard coating film.

The hard coating films in the invention preferably have a laminate structure of the first composition hard coating film and the second composition hard coating film. One preferred member structure of the invention is shown in FIG. 2. The constitution of the hard coating film 2 of the invention comprises a second composition hard coating film 4 and a first composition hard coating film 5 as formed on the surface of a substrate 3. The thickness of the second composition hard coating film may be from 100 nm to less than 5000 nm, more preferably from 100 nm to less than 3000 nm. The thickness of the first composition hard coating film may be from 10 nm to less than 1000 nm, more preferably from 40 nm to less than 600 nm. The main role of the second composition hard coating film in the invention is to act as an assistant for the first composition hard coating film so that the first film may sufficiently exhibit its effects. As the case may be, the ratio of the first composition hard coating film to the entire hard coating films could not be increased from the viewpoint of the residual compression stress of the film, and in such a case, the second composition hard coating film is made thick. A preferred thickness ratio of the first composition hard coating film and the second composition hard coating film is such that, when the overall thickness is considered 100, the ratio of the first composition hard coating film is from 2% to 50%. In order that the first composition hard coating film could sufficiently exhibit its characteristics, the adhesion strength of the second composition hard coating film to the substrate surface, and the hardness and the residual compression stress thereof are important factors. In this, for example, the substrate 3 may be any of cemented carbide having a Co content of from 3% by weight to less than 14% by weight, cermet, high-speed steel, sintered boron nitride, ceramics. The cutting tools are, for example, end mill, drill, reamer, broach, hob cutter, microdrill, router, milling insert, turning insert.

For producing the first composition hard coating film in the invention, a sputtering method (SP method) is effective. In this case, a composite target of silicon carbide and boron nitride is preferably used; however, silicon carbide and boron nitride may be put on different evaporation sources and they may be sputtered simultaneously to produce the intended object. For producing the multilayer film-coated member of the invention, it is desirable that the first composition hard coating film is formed according to an SP method, and the second composition hard coating film is formed according to an arc ion plating method (AIP method) and/or an SP method. For example, in FIG. 2, it is important to improve the adhesion strength between the second composition hard coating film 4 and the substrate 3, and therefore an AIP method is suitable to the boundary between 3 and 4. In other areas than the boundary, coating according to an SP method may be effective for improving the abrasion resistance. The SP method may be combined with an AIP method. The first composition hard coating film 5 may be coated according to an SP method. The power in the SP method and the AIP method for the coating may be a high-frequency power or a direct current power; but from the viewpoint of the stability in the coating process, the sputtering power source is preferably a high-frequency power. As a bias power source, a high-frequency bias power source is more preferred in consideration of the electroconductivity of the hard coating film and the mechanical characteristics of the hard coating film.

FIG. 3 schematically shows the structure of a coating machine 14 for carrying out the invention. The coating machine 14 comprises a vacuum chamber 11, four types of coating sources 6, 7, 8, 9, and their shutters 15, 16, 17, 18. In this, 6 and 8 are RF-coating sources; and 7 and 9 are arc sources. The coating sources have their shutters that individually shut off the sources. Thus acting independently of each other, the individual coating sources may be separately shut off. Accordingly, it is unnecessary to stop the coating sources during the coating operation. Argon as a process gas and $N_2$, $O_2$ and $C_2H_2$ as reaction gases are fed into the vacuum chamber 11, for which the chamber has a vapor duct 13 equipped with a switch. The substrate holder 12 is provided with a rotary mechanism, and this is connected to a DC bias power source or RF bias power source 10. One preferred embodiment of the operation and the coating mode with the coating machine 14 in the coating method of the invention is described below.

(1) Cleaning:

A substrate 3 is set on a substrate holder 12, and then heated at 250° C. to 800° C. During this, the shutters of the sources are all shut. The substrate is ion-cleaned by applying a pulse bias voltage from the bias power source 10.

(2) Coating with Second Composition Hard Coating Film:

After the cleaning, the shutters 16 and 18 of the arc sources 7 and 9 are opened, and the second composition hard coating film is formed. The second composition hard coating film may be formed according to a DC-SP method or a DC-AIP method. The DC bias voltage to be applied during the film formation is preferably from about 10 V to 400 V. A bipolar pulse bias voltage may also be used. In this step, the frequency is, for example, within a range of from 0.1 kHz to 300 kHz, and the positive bias voltage is especially preferably within a range of from 3 V to 100 V. The pulse/pose ratio may be within a range of from 0.1 to 0.95. During the formation of the second composition hard coating film, the RF coating sources 6 and 8 are operated while the shutters 15 and 17 are shut. This is for the purpose of removing the impurities such as oxide from the target surface. After the formation of the second composition hard coating film, the shutters 15 and 17 are opened, and the RF-coating sources 6 and 8 are simultaneously operated to start film formation.

(3) Coating with First Composition Hard Coating Film:

The first composition hard coating film, SiBCNO film is formed from the RF coating sources 6 and 8. For the RF coating sources 6 and 8, preferred is a composite target material of silicon carbide and boron nitride. The outermost surface layer of the outer layer of the first composition hard coating film may contain oxygen by applying a process gas such as oxygen to the vacuum chamber 11 via the vapor duct 13. The outermost surface layer of the outer layer of the first composition hard coating film may be a SiBCNO layer, in which the oxygen content is preferably higher in the more outer layer. This layer functions as a protective layer against abrasion.

The invention is described with reference to the following Examples.

EXAMPLES

This is for evaluating the film properties of the hard coating film in the invention. Using a cemented carbide having a Co content of from 3% by weight to less than 14% by weight, a hard coating film was formed according to the following coating method.

The first coating method comprises a first step of heating a tool at 500° C., a second step of ion cleaning for about 30 minutes by applying a pulse bias voltage having a negative voltage of 200 V, a positive voltage of 30 V, a frequency of 20 kHz and a pulse/pose ratio of 4, a third step of coating with (AlTi)N by an arc source, a fourth step of coating with (AlTi)N by an arc source and washing the target surface by discharging the sputtering target while the shutter is shut, a fifth step of coating with SiBNCO by using a target having a molar blend ratio, BN/SiC of ⅓ in a mode of RF sputtering with an RF-coating source, and a sixth step of coating with SiBNCO by RF+DC by applying a DC bias having a negative voltage of 50 V, in addition to the RF bias. In this, the coating was attained through the above 1st to 6th steps. Finally, a laminate structure of (AlTi)N and SiBNCO laminated in that order was formed, and the film thickness was about 3 μm. In the RF sputtering, the temperature inside the chamber was so controlled that the tool temperature could be not higher than 400° C. In addition, the temperature inside the chamber was so controlled that the tool temperature could be about 500° C. during film formation to form the surface layer and around it. The sample coated according to the first coating method is referred to as a sample 1 of the invention. The sample prepared by using oxygen as the reaction gas in the RF-sputtering step so as to increase the oxygen concentration in the vicinity of the surface layer within a region from the uppermost surface layer of the first composition hard coating film to less than 100 nm in the film thickness direction, is referred to as a sample 12 of the invention.

The second coating method is as follows: In RF sputtering, used was a target having a molar blend ratio, BN/SiC of 1/1 as an RF coating source. The sample coated according to the second coating method is a conventional sample 25. The sample prepared by RF-sputtering with a target having a molar blend ratio, BN/SiC of 3/1 is referred to as a conventional sample 26. A sample prepared by using oxygen as a reaction gas in film formation with a controlled flow rate of 0 to the process gas Ar, 0/Ar=0.3, is referred to as a comparative sample 30.

The third coating method is as follows: A second composition hard coating film was formed according to a DC sputtering method, and the first composition hard coating film was formed according to an RF sputtering method. The samples produced according to the third coating method are referred to as samples 23 and 24 of the invention.

The details of the samples are shown in Tables 1 and 2. Additional examples for second hard coating films can be found following Table 1.

TABLE 1

Constitution and Composition of Samples

| | Sample No | Second composition hard coating film | First composition hard coating film Inner | First composition hard coating film Outer |
|---|---|---|---|---|
| Invention | 1 | (Al0.6Ti0.4)N | — | Si(0.33)B(0.13)N(0.11)C(0.38)O(0.05) |
| | 2 | (Al0.6Ti0.4)N/(Ti0.8Si0.2)N | — | Si(0.32)B(0.12)N(0.12)C(0.39)O(0.05) |
| | 3 | (Al0.6Ti0.4)N/(Cr0.9Si0.1)BN | — | Si(0.29)B(0.14)N(0.13)C(0.38)O(0.06) |
| | 4 | (Al0.5Ti0.4Cr0.1)N | — | Si(0.28)B(0.14)N(0.14)C(0.40)O(0.04) |
| | 5 | (Al0.5Ti0.4Nb0.1)N | — | Si(0.30)B(0.15)N(0.13)C(0.38)O(0.04) |
| | 6 | (Al0.5Ti0.4Si0.1)N | — | Si(0.32)B(0.14)N(0.15)C(0.35)O(0.04) |
| | 7 | (Al0.5Ti0.4W0.1)N | — | Si(0.31)B(0.13)N(0.14)C(0.38)O(0.04) |
| | 8 | (Al0.5Ti0.4W0.1)SN | — | Si(0.32)B(0.13)N(0.12)C(0.37)O(0.06) |
| | 9 | (Al0.7Cr0.3)N | — | Si(0.32)B(0.14)N(0.12)C(0.38)O(0.04) |
| | 10 | (Al0.6Cr0.3Si0.1)N | — | Si(0.33)B(0.11)N(0.12)C(0.38)O(0.06) |
| | 11 | (Al0.6Ti0.4)N | SiBNCO | Si(0.18)B(0.11)N(0.51)C(0.15)O(0.05) |

TABLE 1-continued

Constitution and Composition of Samples

| | Sample No | Second composition hard coating film | First composition hard coating film Inner | First composition hard coating film Outer |
|---|---|---|---|---|
| | 12 | (Al0.6Ti0.4)N | SiBNCO | Si(0.43)B(0.10)N(0.11)C(0.25)O(0.11) |
| | 13 | (Al0.6Ti0.4)N | SiBNCO | Si(0.21)B(0.07)N(0.06)C(0.60)O(0.06) |
| | 14 | (Al0.6Ti0.4)N | — | Si(0.31)B(0.14)N(0.11)C(0.35)O(0.09) |
| | 15 | (Al0.5Ti0.5)ON | — | Si(0.31)B(0.15)N(0.13)C(0.37)O(0.04) |
| | 16 | (Ti0.9Nb0.1)CN | — | Si(0.30)B(0.13)N(0.12)C(0.40)O(0.05) |
| | 17 | (Ti0.8Si0.2)N | — | Si(0.29)B(0.14)N(0.15)C(0.38)O(0.04) |
| | 18 | (Ti0.9W0.1)N | — | Si(0.32)B(0.13)N(0.13)C(0.37)O(0.05) |
| | 19 | (Cr0.3Al0.6W0.1)N | — | Si(0.33)B(0.11)N(0.11)C(0.41)O(0.04) |
| | 20 | (Cr0.9Si0.1)BNO | — | Si(0.34)B(0.10)N(0.11)C(0.40)O(0.05) |
| | 21 | (Cr0.9Nb0.1)N | — | Si(0.31)B(0.14)N(0.13)C(0.38)O(0.04) |
| | 22 | (Cr0.9W0.1)CN | — | Si(0.29)B(0.13)N(0.11)C(0.41)O(0.06) |
| | 23 | (W0.4Si0.6)CN | — | Si(0.31)B(0.13)N(0.12)C(0.39)O(0.05) |
| | 24 | (Nb0.4Si0.6)CN | — | Si(0.30)B(0.14)N(0.13)C(0.36)O(0.07) |
| | 25 | (Ti0.9V0.1)N | — | Si(0.28)B(0.13)N(0.13)C(0.39)O(0.07) |
| | 26 | (Ti0.4Al0.5Mo0.1)N | — | Si(0.29)B(0.13)N(0.13)C(0.40)O(0.05) |
| | 27 | (Ti0.9Zr0.1)N | — | Si(0.27)B(0.16)N(0.14)C(0.39)O(0.04) |
| | 28 | (Ti0.4Al0.5V0.1)N | — | Si(0.30)B(0.14)N(0.13)C(0.37)O(0.06) |
| | 29 | (Ti0.7Si0.2Nb0.1)N | — | Si(0.32)B(0.13)N(0.14)C(0.38)O(0.03) |
| | 30 | (Ti0.7Si0.2V0.1)N | — | Si(0.31)B(0.13)N(0.15)C(0.37)O(0.04) |
| | 31 | (Al0.6Cr0.3Nb0.1)N | — | Si(0.30)B(0.14)N(0.15)C(0.36)O(0.05) |
| | 32 | (Al0.6Cr0.3V0.1)N | — | Si(0.31)B(0.15)N(0.14)C(0.36)O(0.04) |
| | 33 | (Al0.6Cr0.3Si0.1)N/(Ti0.8Si0.2)N | — | Si(0.32)B(0.14)N(0.13)C(0.36)O(0.05) |
| | 34 | (Al0.5Ti0.4Si0.1)N/(Ti0.8Si0.2)N | — | Si(0.33)B(0.14)N(0.12)C(0.37)O(0.05) |
| Convention | 35 | (Al0.6Ti0.4)N | — | Si(0.25)B(0.25)N(0.2)C(0.25)O(0.05) |
| | 36 | (Al0.6Ti0.4)N | — | Si(0.15)B(0.35)N(0.3)C(0.15)O(0.05) |
| | 37 | (Al0.6Ti0.4)N | — | — |
| | 38 | (Al0.6Ti0.4)N/TiN | — | — |
| | 39 | (Al0.6Ti0.4)N/CrN | — | — |
| Comparison | 40 | (Al0.6Ti0.4)N | SiBNCO | Si(0.22)B(0.10)N(0.12)C(C0.28)O(0.28) |
| | 41 | (Al0.6Ti0.4)N | SiBNCO | Si(0.35)B(0.08)N(0.11)C(0.41)O(0.05) |
| | 42 | (Al0.6Ti0.4)N | SiBNCO | Si(0.31)B(0.15)N(0.12)C(0.38)O(0.04) |

In addition to the example of Table 1, a second composition hard coating film may also include Ni, Ce, or Mg forming among others for example chemical compositions like $Ti_aSi_bCe_c$, in particular for example $Ti_{0.9}Si_{0.09}Ce_{0.01}N$ or $Al_{0.66}Cr_{0.30}Mg_{0.02}Si_{0.02}N$ or $Cr_{0.84}Ni_{0.1}B_{0.05}Si_{0.01}$.

TABLE 2

Test Results of Samples

| | Sample No | Si—O, B—O bonding | α/β | X/Y | Compisition of claim | Adhesion resistance | Tool life |
|---|---|---|---|---|---|---|---|
| Invention | 1 | ○ | 17.75 | 6.46 | ○ | A | 3.5 |
| | 2 | ○ | 17.82 | 6.64 | ○ | A | 4.1 |
| | 3 | ○ | 17.68 | 6.72 | ○ | A | 3.8 |
| | 4 | ○ | 17.91 | 6.63 | ○ | A | 3.6 |
| | 5 | ○ | 17.76 | 6.57 | ○ | A | 3.7 |
| | 6 | ○ | 17.87 | 6.48 | ○ | A | 3.6 |
| | 7 | ○ | 17.81 | 6.63 | ○ | A | 3.6 |
| | 8 | ○ | 17.88 | 6.58 | ○ | A | 3.8 |
| | 9 | ○ | 17.87 | 6.59 | ○ | A | 3.3 |
| | 10 | ○ | 17.75 | 6.48 | ○ | A | 3.4 |
| | 11 | ○ | 12.82 | 7.76 | ○ | A | 2.8 |
| | 12 | ○ | 11.23 | 5.46 | ○ | A | 3.7 |
| | 13 | ○ | 19.74 | 6.43 | ○ | A | 3.3 |
| | 14 | ○ | 17.85 | 6.56 | ○ | A | 3.5 |
| | 15 | ○ | 18.04 | 6.54 | ○ | A | 2.9 |
| | 16 | ○ | 17.94 | 6.45 | ○ | A | 2.8 |
| | 17 | ○ | 17.78 | 6.63 | ○ | A | 3.6 |
| | 18 | ○ | 17.67 | 6.54 | ○ | A | 3.4 |
| | 19 | ○ | 17.79 | 6.58 | ○ | A | 3.3 |
| | 20 | ○ | 17.76 | 6.49 | ○ | A | 2.7 |
| | 21 | ○ | 17.83 | 6.58 | ○ | A | 2.6 |
| | 22 | ○ | 17.88 | 6.57 | ○ | A | 2.7 |
| | 23 | ○ | 17.76 | 6.56 | ○ | A | 2.9 |
| | 24 | ○ | 17.93 | 6.67 | ○ | A | 3.0 |
| | 25 | ○ | 15.64 | 7.04 | ○ | A | 3.4 |
| | 26 | ○ | 16.82 | 6.95 | ○ | A | 3.1 |
| | 27 | ○ | 16.72 | 7.88 | ○ | A | 3.8 |
| | 28 | ○ | 17.53 | 8.01 | ○ | A | 3.8 |

TABLE 2-continued

Test Results of Samples

|  | Sample No | Si—O, B—O bonding | α/β | X/Y | Compisition of claim | Adhesion resistance | Tool life |
|---|---|---|---|---|---|---|---|
|  | 29 | o | 14.39 | 6.96 | o | A | 4.1 |
|  | 30 | o | 18.21 | 7.21 | o | A | 2.9 |
|  | 31 | o | 13.97 | 5.96 | o | A | 3.1 |
|  | 32 | o | 14.14 | 6.91 | o | A | 3.7 |
|  | 33 | o | 16.28 | 7.31 | o | A | 3.7 |
|  | 34 | o | 17.36 | 8.64 | o | A | 3.4 |
| Convention | 35 | o | 14.54 | 4.31 | x | B | 2.1 |
|  | 36 | o | 13.57 | 3.54 | x | C | 1.8 |
|  | 37 | x | — | — | x | D | 1.5 |
|  | 38 | x | — | — | x | C | 1.3 |
|  | 39 | x | — | — | x | B | 1.6 |
| Comparison | 40 | o | 8.46 | 3.48 | x | B | 1.1 |
|  | 41 | o | 22.04 | 12.04 | o | C | 2.0 |
|  | 42 | o | 22.54 | 6.67 | o | C | 2.3 | o: satisfy,
x: not satisfy

Regarding the chemical compositions of the second composition hard coating films as disclosed both in the description and in the claims of the present patent application, in particular as presented in the left column of Table 1, the convention concerning the system of notation of the chemical formulae is understood as follows: the chemical elements are subdivided into two groups of chemical elements. Group G consists of chemical elements $G^i$, which are B, N, O, C, or S. Group M consists of all other chemical elements $M^i$ used in the second composition hard coating layer. That is group M includes in particular the chemical elements $M^i$ which are Al, Ti, Cr, Ni, Ce, Mg, Nb, W, Si, V, Zr and Mo. Regarding this, all chemical formulae characterizing the composition hard coating film have the following form:

$$(\text{Group } M \text{ elements } M^i_{yi})_x (\text{Group } G \text{ elements } G^i)_{1-X}$$

with $$\sum_{i=1}^{n} yi = 100\%$$

and $$0.4 < X < 0.6$$

For example Sample No. 20 according to Table 1 is characterized by the chemical formula:

$$(Cr_{0.9}Si_{0.1})BNO$$

consisting of the group M elements $M^i$ which are in this example Cr and Si and further consisting of group G elements $G^i$ which are in the present example of sample No. 20 B, N, and O, wherein $(Cr_{0.9}Si_{0.1})BNO$ in the scope of the present invention means $$(Cr_{0.9}Si_{0.1})_X(BNO)_{1-X}$$

with 0.4<X<0.6, as generally defined above by the expression $$(\text{Group } M \text{ elements})_X (\text{Group } G \text{ elements})_{1-X}$$

with 0.4<X<0.6.

In heat treatment, the samples of the invention and the conventional samples were compared in point of the formation of a flux protective layer in the surface layer. Regarding the test condition, an ultrafine particle cemented carbide insert having a Co content of 8% by weight was used as the substrate. In air at 900° C. and at a humidity of 58%, the samples were kept for one hour, and then the cross section of the hard coating film was observed with a transmission electronic microscope (TEM). In this test, the sample 1 of the invention and the conventional sample 27 were evaluated. FIG. 4 and FIG. 5 show the TEM pictures of the treated samples. FIG. 4 and FIG. 5 confirm the formation of a dense flux layer on the surface layer of the sample 1 of the invention. In the conventional sample 27, neither dense flux layer nor oxide layer was formed on the surface layer, but a porous oxide layer was formed. In this, the coating film partly peeled off. Accordingly, it was confirmed that the coating film of the invention may form a dense layer on the surface layer thereof. It is known that the layer formed of the flux exhibits an effect of inhibiting oxidation and exhibits an effect of improving the heat resistance of the coating film.

This is for evaluating the effect of the coating film of the invention for preventing adhesion thereto. The coated samples of the invention and the conventional coated samples were tested for adhesion resistance, according to a ball-on-disc type frictional abrasion test. From the condition of the matter adhering to the coating film around the abraded area thereof, the tested samples were evaluated according to the following criteria.

A: No matter adhering to the abraded area was found.
B: Some matter adhered to a range of from the entire periphery of the abraded area to ½.
C: Some matter adhered to a range of from the entire periphery of the abraded area to ¾.
D: Some matter adhered to the entire periphery of the abraded area.

For the measurement, used were a ball (φ6.0) made of SUJ2, and a disc produced by coating an ultra-hard insert of ISO Lot SNMN120408 corresponding to K10 with the coating film to be tested herein.

(Test Condition)
Sliding speed: 50 mm/sec
Sliding radius: 4.0 mm
Load: 10 N
Sliding distance: 50 m
Ambient temperature: room temperature
Ambient atmosphere: air, no lubrication The results in Table 2 confirm good adhesion resistance of the samples of the invention over the conventional samples.

The conventional samples 25 and 26 are outside the composition range of the invention. In these, the B content is over the range of the invention. As containing too much B, the samples formed too much flux, and as a result, the flux layer to be a protective film was fluidized and was therefore ineffective. This is because, in these conventional samples, X/Y≦5.0, or that is, the samples contain much B—O bond, therefore forming much flux at low temperatures. From these, it is understood that the composition range of the invention is the best for exhibiting the intended effect. The conventional samples 27 and 28 had extreme adhesion; and CrN in the conventional sample 29 which is said effective for preventing adhesion also had adhesion. To that effect, the coating films of the invention exhibited the best results. The comparative sample 31 had adhesion in a broad range. This had 20.0≦α/β and 10.0≦X/Y, or that is, the quantities of the Si—O and B—O bonds in this are small, and therefore this could not form sufficient flux, and could not be effective for preventing adhesion. From these results, it is known that the range of 5.0≦X/Y≦10.0 is effective for preventing adhesion.

For confirming the effect of preventing adhesion, the samples were tested by using them in cutting work. The test condition is shown below. In the cutting test, the samples were evaluated as follows: The length of cut with which the width of flank wear land reached 0.2 mm was measured; or the length of cut was measured at a time when the cutting work became extremely unstable, for example, when the cutting tool broken, sparked or gave noise or when the surface of the object being cut was peeled or burnt. Thus measured, the length of cut indicates the life of the cutting tool tested.
(Test Condition)
Tool: Indexable insert end mill (diameter 32 mm)
Cutting mode: high-speed rough cutting
Object to be cut: SKD61 (220HB)
Cutting direction: axial direction, 3.0 mm; radial direction 10.0 mm
Revolution of main axis: 1.2 kmin$^{-1}$
Table feeding: 0.18 m/min
Cutting oil: air blow, dry cutting The samples coated with the film of the invention as the surface layer showed good cutting capability. The conventional samples 25 and 26 had minor film peeling. This is film peeling induced by adhesion. This is because, as compared with that in the coating films of the invention, the B content in the comparative samples was large, and therefore the flux was fluidized and could not exhibit an effect of preventing adhesion. The conventional samples 27 to 29 also had film peeling caused by adhesion. All the conventional samples had film peeling, and their working life was thereby shortened. The comparative sample 30 had 20.0≦α/β and 10.0≦X/Y, or that is, it contained many Si—O and B—O bonds, and therefore, its abrasion resistance was poor and the wear width was large. The comparative sample 31 had 20.0≦α/β, or that is, it contained many Si—C bonds, and therefore, it had excellent abrasion resistance; however, it had X/Y≦5/0, or that is, the quantity of the B—O bonds therein was small, and therefore, its flux formation was insufficient therefore showing film peeling caused by adhesion. The samples of the invention had no film peeling, and exhibited good cutting capability. It is known that the coating films satisfying 10.0≦α/β≦20.0 and 5.0≦X/Y≦10.0 are excellent as resistant to both abrasion and adhesion.

Finally, by FIG. 6 a preferred embodiment of a multi layer film-coated member according to the invention is shown which is very important in practice. Regarding the special embodiment of FIG. 6, a second composition hard coating film 4 was deposited onto the substrate 3 using an arc coating technique. The thickness of this second composition hard coating film is between 0.5 μm and 10 μm and is preferably about 1 μm.

As an intermediate layer, an alternating sequence of first composition hard coating layers 5 and second composition hard coating 4 layers was then coated onto the second composition hard coating film 4 as which was first directly coated onto the substrate 3. The thickness of a single layer of the sequence of the first and second composition hard coating films 4,5 is between 2.5 nm and 100 nm, wherein the sequence of the first and the second composition hard coating films 4,5 may comprise a considerable number of single layers, for example up to 10 layers, or up to 50 to 100 layers or up to 1000 layers or in special cases more than 1000 single layers. Accordingly the thickness of the entire sequence of single layers is for example between 0.5 μm and 10 μm and is in a special embodiment of the present invention about 1 μm.

On top of the sequence of the plurality of alternating single hard coating films 4,5, a sequence of a plurality of different first composition hard coating films 5 is provided as a top layer. The entire thickness of the sequence of different first composition hard coating films 5 can be between 10 nm and 2000 nm, preferably between 20 nm and 100 nm. The thickness of a single first composition hard coating film 5 of the top layer is preferably between 2 nm and 100 nm.

The single layers of first composition hard coating films 5 of the top layer may differ with respect to their chemical composition, for example with respect to the oxygen content or an other chemical component. That is the a/b ratio and or the x/y ratio may vary from one single first composition hard coating film 5 to another one.

Accordingly, the chemical composition of the first composition hard coating films of the intermediate layers and the chemical composition of the second composition hard coating films 4 may vary from one single layer of the intermediate layer to another one. For example, one single second composition hard 4 coating film may be a TiSiCeN-film 4 and another single second composition hard coating film 4 can be a AlCoSN-film 4.

Preferably, the first composition hard coating films 5 are deposited by using a sputter process wherein the second composition hard coating films 4 are produced using an arc technique.

According to the invention, a cutting tool, a mold and a combustion engine or a member requiring heat resistance and abrasion resistance for airplanes, ground turbines, engines, gaskets, gears, pistons may have a multilayer film as described above in accordance with the present invention.

EXPLANATION TO THE REFERENCE NUMBER IN THE FIGURES

1—$B_2O_3$—$SiO_2$ binary phase diagram
2—Multilayer coating film
3—Substrate
4—Second composition hard coating film
5—First composition hard coating film
6—RF coating source
7—Arc source
8—RF coating source
9—Arc source
10—DC bias power/RF bias power
11—Vacuum chamber
12—Substrate holder
13—Vapor duct
14—Coating machine
15—Shutter 16—Shutter
17—Shutter
18—Shutter
19—Dense flux oxide layer of invention sample 1
20—Oxide layer of convention sample 17

What is claimed is:

1. A multilayer film-coated member fabricated by coating the surface of a substrate with at least two hard coating films having different compositions, which has at least a first composition hard coating film to be the outer layer of the member and a second composition hard coating film to be the inner layer thereof, and in which the first composition hard coating film represented by $Si_aB_bN_cC_dO_e$ with $a+b+c+d+e=1$, $0.1 \leq a \leq 0.5$, $0.01 \leq b \leq 0.2$, $0.05 \leq c \leq 0.6$, $0.1 \leq d \leq 0.7$ and $0 < e \leq 0.2$, the second composition hard coating film is a hard film having at least two selected from Al, Ti, Cr, Ni, Ce, Mg, Nb, W, Si, V, Zr and Mo and at least one selected from B, C, O and S and in X-ray photoelectric spectrometry (XPS) of the first composition hard coating film, Si—O bond and B—O bond are detected, the ratio of the peak area $\alpha$ of Si—C to the peak area $\beta$ of Si—O, $\alpha/\beta$, as obtained from the peak separation of the 2p orbit of Si, satisfies $10.0 \leq \alpha/\beta \leq 20.0$, and the ratio of the peak area X of B—O to the peak area Y of B—N, X/Y, as obtained from the peak separation of the 1s orbit of B, satisfies $5.0 \leq X/Y \leq 10.0$.

2. A multilayer film-coated member in accordance with claim 1, wherein $0.05 \leq b \leq 0.2$.

3. A multilayer film-coated member in accordance with claim 1, wherein $0.1 < c < 0.35$.

4. A multilayer film-coated member in accordance with claim 1, wherein $0.15 < d \leq 0.4$.

5. A multilayer film-coated member in accordance with claim 1, wherein $0.01 < e \leq 0.15$.

6. A multilayer film-coated member in accordance with claim 1, wherein the first composition hard coating layer and/or the second composition hard coating layer has a multilayer structure.

7. A method for producing a multilayer film-coated member, comprising coating the surface of a substrate with at least two hard coating films having different compositions, which has at least a first composition hard coating film to be the outer layer of the member and a second composition hard coating film to be the inner layer thereof, and in which the first composition hard coating film is represented by $Si_aB_bN_cC_dO_e$ with $a+b+c+d+e=1$, $0.1 \leq a \leq 0.5$, $0.01 \leq b \leq 0.2$, $0.05 \leq c \leq 0.6$, $0.1 \leq d \leq 0.7$ and $0 < e \leq 0.2$, the second composition hard coating film is a hard film having at least two selected from Al, Ti, Cr, Ni, Ce, Mg, Nb, W, Si, V, Zr and Mo and at least one selected from B, C, O and S and in X-ray photoelectric spectrometry (XPS) of the first composition hard coating film, Si—O bond and B—O bond are detected, the ratio of the peak area $\alpha$ of Si—C to the peak area $\beta$ of Si—O, $\alpha/\beta$, as obtained from the peak separation of the 2p orbit of Si, satisfies $10.0 \leq \alpha/\beta \leq 20.0$, and the ratio of the peak area X of B—O to the peak area Y of B—N, X/Y, as obtained from the peak separation of the 1s orbit of B, satisfies $5.0 \leq X/Y \leq 10.0$, wherein the second composition hard coating film is deposited by a sputtering process and/or by an arc process, by using preferably $O_2$ and/or $N_2$ and or $C_2H_2$ as a process gas, and the first composition hard coating film is deposited by a sputtering process.

8. A method in accordance with claim 7, wherein a BN/SiC-Target is used for depositing the first composition hard coating film by a RF-sputtering process, preferably using a $N_2$ process gas.

9. A method in accordance with claim 7, wherein a composite target consisting of the chemical elements B, C, Si is used for depositing the first composition hard coating film, preferably using a $N_2$ process gas.

10. A method in accordance with claim 9, wherein the composite target comprises a matrix consisting of C and separate areas consisting of B4C and/or Si.

11. A method in accordance with claim 9, wherein the composite target comprises a matrix consisting of $B_4C$ and separate areas consisting of Si.

12. A method in accordance with claim 9, wherein a RF-sputtering process, preferably a DC-sputtering process, more preferably a pulsed DC-sputtering process is used, particular a high power sputtering process.

13. A cutting tool, a mold and a combustion engine or a member requiring heat resistance and abrasion resistance for airplanes, ground turbines, engines, gaskets, gears, pistons having a multilayer film in accordance with claim 1.

* * * * *